(12) United States Patent
Fujiki

(10) Patent No.: US 6,509,846 B1
(45) Date of Patent: Jan. 21, 2003

(54) KEY MATRIX CIRCUIT

(75) Inventor: Shiro Fujiki, Yokohama (JP)

(73) Assignee: Vertex Standard Co., Ltd, Tokyo (JP)

( * ) Notice: Subject to any disclaimer, the term of this patent is extended or adjusted under 35 U.S.C. 154(b) by 277 days.

(21) Appl. No.: 09/632,111

(22) Filed: Aug. 3, 2000

(30) Foreign Application Priority Data

Aug. 4, 1999 (JP) .......................................... 11-220965

(51) Int. Cl.[7] .............................................. H03K 19/94
(52) U.S. Cl. ............................. 341/26; 341/20; 341/22; 340/14.1
(58) Field of Search ............................. 341/22, 20, 26; 340/14.1

(56) References Cited

U.S. PATENT DOCUMENTS

| | | | | |
|---|---|---|---|---|
| 5,181,030 A | * | 1/1993 | Itaya et al. | 178/18.06 |
| 5,929,790 A | * | 7/1999 | Lim | 340/14.1 |
| 6,184,805 B1 | * | 2/2001 | Uggmark | 341/20 |
| 6,222,466 B1 | * | 4/2001 | Uggmark | 327/101 |

* cited by examiner

Primary Examiner—Michael Horabik
Assistant Examiner—Albert K. Wong
(74) Attorney, Agent, or Firm—Fulwider Patton Lee & Utecht, LLP

(57) ABSTRACT

A key matrix circuit has a switching circuit with a first terminal and a second terminal that are switched on and off by pressing a selection key of a plurality of selection keys arranged in an N-row-by-M-column matrix, thereby making connection to a common ground circuit when a selection key is pressed. The key matrix circuit has a first voltage-dividing circuit connected between a connection circuit that connects the first terminals of the first row and a fixed power supply voltage, and a second voltage-dividing circuit connected between a connection circuit that connects the second terminals of the first column and the fixed power supply voltage, the connection points between resistances to of the first voltage-dividing circuit being connected to the connection circuits connected to the first terminals of the other rows, and the connection points between resistances of the second voltage-dividing circuit being connected to the connection circuits of the other rows. An output voltage at the connection point between the first voltage-dividing circuit and an output voltage at the connection point between the second voltage-dividing circuit are input to a microcomputer circuit. Based on combinations of the voltage levels, the microcomputer circuit references a table prepared beforehand, so as to recognize what selection key has been pressed.

5 Claims, 6 Drawing Sheets

Vcc = 5 [V]

R1 = 1kΩ   R2 = 250Ω   R3 = 450Ω   R4 = 800Ω

R5 = 1kΩ   R6 = 250Ω   R7 = 450Ω   R8 = 800Ω

KEY MATRIX CIRCUIT

BACKGROUND OF THE INVENTION

1. Field of the Invention

The present invention relates to a key matrix circuit used in radio equipment or the like, and more particularly it relates to a circuit configuration with a minimized number of input circuits to a microcomputer circuit for recognition of selected keys, and to an associated keyboard and circuit board construction.

2. Description of the Related Art

In the past, a keyboard in which selection and setting keys are arranged in a matrix was applied to the operating panel of a transceiver or the like.

FIG. 9 shows a circuit diagram of such a keyboard, which has a 4-by-4 matrix of keys enabling selection of hexadecimal values from 0 to f.

With this key matrix circuit, there are lines 101 for the circuits 1 to 4 corresponding to the keys in the X direction (row direction), lines 102 for the circuits 5 to 8 corresponding to the keys in the Y direction (column direction), and selection keys 103 at intersections between these circuits.

The lines 101 for circuits 1 to 4 are each connected to a power supply Vcc via a resistance Rx1 to Rx4, respectively, and the lines 102 for circuits 5 to 8 are each connected to ground via a resistance Ry5 to Ry8, respectively.

Therefore, when an arbitrary selection key is set t on, a p line in the X direction and a q line in the Y direction which intersect at the key are connected, a voltage (Vd) that is divided from the power supply voltage Vcc by the resistance Rxp and Ryq is output to each circuit. The lines 101 for circuits 1 to 4 and the lines 102 for circuits 5 to 8 are connected to input ports of a microcomputer circuit, which, based on the event of the voltage on the X-direction p line and the Y-direction q line becoming the voltage Vd, recognizes which key of the 16 selection keys has been pressed, in response to which a control command or the like corresponding to the selected key is output.

Another method is the singular method shown in FIG. 10.

As shown in FIG. 10, this is the simplest system, in which if there are 16 selection keys, an on/off signal from each of the selection keys KEY1 to KEY16 is individually output to an input port of a microcomputer circuit, which monitors the state of each input port, and recognized therefrom which selection key has been pressed.

Yet another method is the A/D method shown in FIG. 11.

In this circuit, if there are 16 selection keys, the power supply voltage Vcc is connected in series to the resistances R1 to R16, and individual selection keys KEY1 to KEY16 are connected between the connection points between the resistances R1 to R16 and ground, and between the far end of resistance R16 and ground, these keys being set to on and off, and the connection point between the resistances R1 and R2 being connected to an input port of a microcomputer circuit.

With the above-noted circuit arrangement, when a key KEYp is pressed, a voltage (Vd) that is the power supply voltage Vcc divided between resistance R1 and the series resistance R1+R2+. . . +Rp) is output to the connection point between resistance R1 and resistance R2, this voltage being A/D converted by the microcomputer circuit, so as to recognize which key has been pressed, in response to the converted voltage level.

In a multiple-key input system using, for example, a ten-key pad to make various data inputs and settings in a transceiver or the like, a microcomputer circuit is used, as noted above, to perform recognition of a selected key and output of a control command and data, because of a desire to reduce the number of wiring lines and reduce the cost of components, there is a desire to use a system with a reduced number of input circuits to the microcomputer circuit and a small number of ports.

It would appear that, in response to this need, using the A/D system shown in FIG. 11, in principle only one circuit is required for a large number of selection keys, the microcomputer circuit performing recognition of what key is pressed from the voltage level after A/D conversion.

However, the usual power supply voltage Vcc of a microcomputer circuit is 5 V, and the need to achieve stable discrimination of a divided voltage imposes a requirement that a threshold be set approximately every 1 V.

Thus, in reality even the A/D system shown in FIG. 11 is limited to discrimination of five levels, or six levels if the open condition is added, so that it is not capable of discriminating the on/off states of 16 selection keys as shown in FIG. 11.

Accordingly, it is an object of the present invention to provide a key matrix circuit configuration that reduces the number of signal circuit lines to a microcomputer that performs recognition of selection keys to the minimum number, while enabling stable recognition of selected keys. It is a further object of the present invention to provide a keyboard having a construction suited to the above-noted circuit configuration.

SUMMARY OF THE INVENTION

To achieve the above-noted objects, the present invention is a key matrix circuit, having a keyboard with a plurality of selection keys arranged in an N-row-by-M-column matrix, a board having switching circuits having a first terminal and a second terminal that are connected to a common ground circuit when a corresponding selection key is pressed, the first terminals of each switching circuit, corresponding to the selected key in the row direction being connected to a first connection circuit in units of rows, and the second terminals of each switching circuit, corresponding to the selected key in the column direction being connection to a second connection circuit in units of columns, an output circuit wherein a fixed-voltage power supply and one circuit of the first connection circuits are connected by a first voltage-dividing circuit formed by a series connection of N resistances, with other first connection circuits connected to points between the other resistances of the first voltage-dividing circuit, a first output point being a resistance connection point of the first connection circuit via one resistance from the fixed-voltage power supply, and wherein a fixed-voltage power supply and one circuit of the second connection circuits are connected by a second voltage-dividing circuit formed by a series connection of M resistances, with other second connection circuits connected to points between the other resistances of the second voltage-dividing circuit, a second output point being a resistance connection point of the second connection circuit via one resistance from the fixed-voltage power supply, and a microcomputer circuit which A/D converts and captures the voltages at the first output point and the second output point of the output circuit and, using a data table, into which are stored identification data and control commands corresponding to combinations of voltage levels that the first output point can take and voltage levels that the second output point can take, these combinations being related to each selection key, performs recognition of a pressed selection key and execution of corresponding control.

According to the present invention, when a selection key is pressed, voltages that are established by the row and column to which the key belongs are output to the first output point and the second output point.

More specifically, by a switching circuit corresponding to a pressed key changing to the on state, the grounded connection location first voltage-dividing circuit and second voltage-dividing circuit, which are series resistance circuits, is set by the row and column to which the pressed key belongs, in response to which the voltage division condition which respect to the fixed-voltage power supply voltage in each of the voltage-dividing circuits is established, each of these divided voltages appearing as outputs at the first output point and the second output point.

When the above occurs, because each of the voltage-dividing circuits is a series resistance circuit, each divided voltage differs, depending upon the row and column to which the pressed selection key belongs.

The microcomputer circuit is provided with a table into which are stored identification data and control commands for each selection key of the keyboard, corresponding to combinations of the voltage level data that the first and second output points can take.

Therefore, based on the combination of the voltage level data obtained by A/D conversion of the voltages at the first output point and the second output point, there is a unique selection key that must have been pressed to result in those voltages. The microcomputer circuit access the above-noted data table to perform recognition of the pressed key, and can therefore output identification data or a control command corresponding to the recognized selection key.

The first voltage-dividing circuit and the second voltage-dividing circuit do not necessarily need to be circuits independent from the circuit board, and can alternately be formed on the same circuit board.

The configuration of the keyboard and circuit board of the present invention can take on the following forms.

In its first form, the configuration of the keyboard is one in which a electrically conductive knob contact is formed on the circuit board side of each of keys of a rubber key pad, and wherein at positions on the circuit board corresponding to each of the selection keys the first and second terminals are formed by an electrically conductive pattern, a common ground circuit being formed by a conductive pattern between the first and second terminals, and wherein the conductive patterns of the first connection circuit, the second connection circuit, and the common ground circuit are formed on the circuit board surface with insulation therebetween.

According to this form of the keyboard and circuit board, by forming the conductive patterns of the first terminal, the second terminal, the common ground circuit, and the first and second connection circuits all on the surface of the circuit board, it is possible to configure a switching circuit whereby the connection between each terminal and the common ground circuit can be switched on and off by the conductive knob contact of each selection key.

In its second form, the keyboard has knobs formed on the circuit board side of each of the selection keys of a rubber key pad, the circuit board sides of each knob having an electrically conductive surface corresponding to a common ground circuit, the circuit board having, at positions corresponding to each of the selection keys of the keyboard, a first terminal and a second terminal formed by conductive patterns, these being formed on the surface of the circuit board with mutual insulation therebetween, and a first connection circuit and a second connection circuit being insulated from the conductive surface on the keyboard side.

According to the above-noted arrangement, it is possible to provide the common ground circuit on the keyboard side, and the first and second terminals and first and second connection circuits can be formed on the circuit board side, thereby facilitating the circuit design.

In the third form of the present invention, the keyboard has knobs formed on the circuit board side of each of the selection keys of a rubber key pad and, at positions on the circuit board surface corresponding to each selection key of the keyboard, a first terminal and a second terminal are formed by conductive patterns, and conductive patterns of a first connection circuit and a second connection circuit being formed so as to be mutually insulated. Between the keyboard and the circuit board, at positions corresponding to each selection key, is formed a resilient and electrically conductive metal sheet having a part protruding toward the knob side, with an insulating layer inserted at only a joining region with respect to the circuit board surface, the resilient metal sheet being used as the common ground circuit.

According to the above-noted arrangement, it is possible to use the resilient metal sheet as the common ground circuit, there being no deformation of the conductive pattern by pressure of the selection key as is the case in the second form of the present invention, and it is further possible to have the resilience needed to return the knob be provided by the resilient metal sheet.

In the fourth form of the present invention, a first terminal and a second terminal formed at positions corresponding to the selection key on the keyboard side are formed as a single terminal, and within the path from the first connection circuit and the second connection circuit to the single terminal, a diode is inserted so that its forward direction is from each of the connection circuits to the single terminal.

According to the above-noted form of the present invention, because a switching circuit can be formed by a single terminal, on/off operations are stabilized, and a diode OR circuit can be used so that in the condition in which a selection key is not pressed, it is possible to maintain a high-impedance condition with respect to the common ground circuit.

BRIEF DESCRIPTION OF THE ACCOMPANYING DRAWINGS

Figure 5:
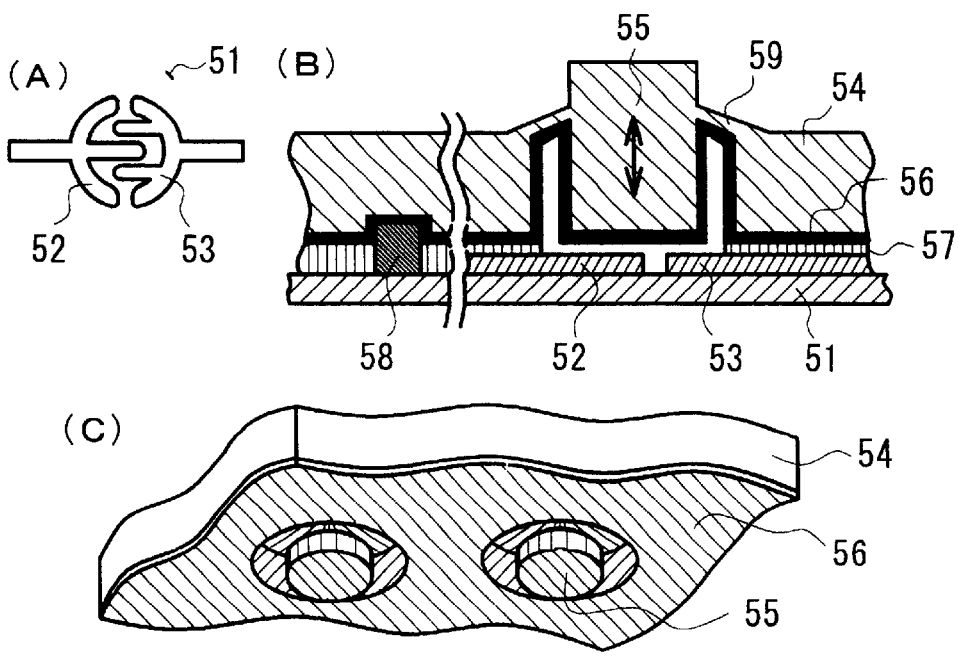

FIG. 5 shows the configuration of a selection key part for method A, with FIG. 5(A) being a plan view of the conductive pattern formed on the circuit board side, FIG. 5(B) being a cross-section view showing the connection condition between the selection key part and the common ground circuit in the end region of the circuit board, and FIG. 5(C) being a perspective view of the keyboard as seen from the rear.

Figure 6:
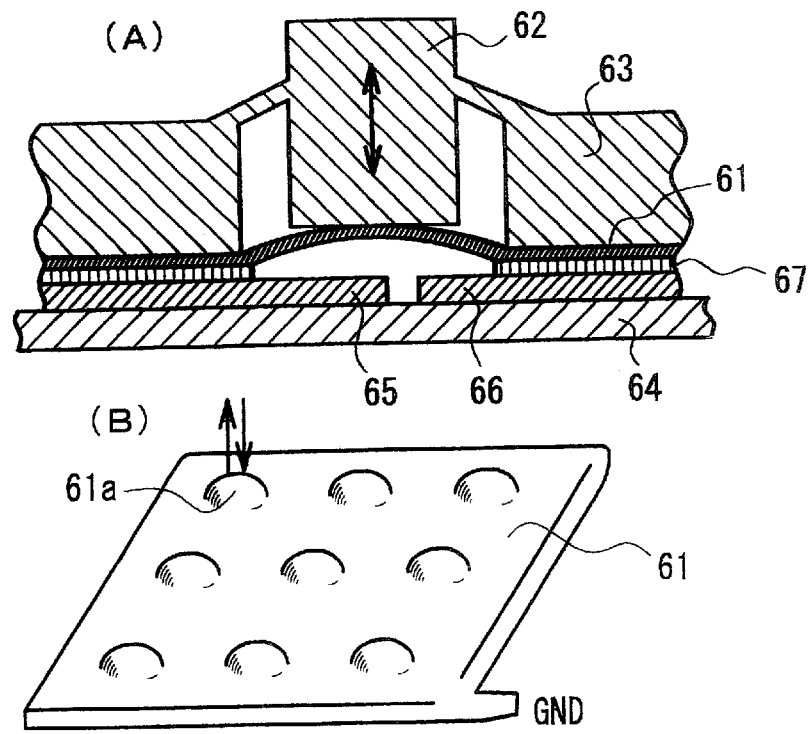

FIG. 6 shows the configuration of a selection key for method B, with FIG. 6(A) being a cross-section view, and FIG. 6(B) being an overall perspective view of the metal sheet applied as the common ground circuit.

Figure 7:
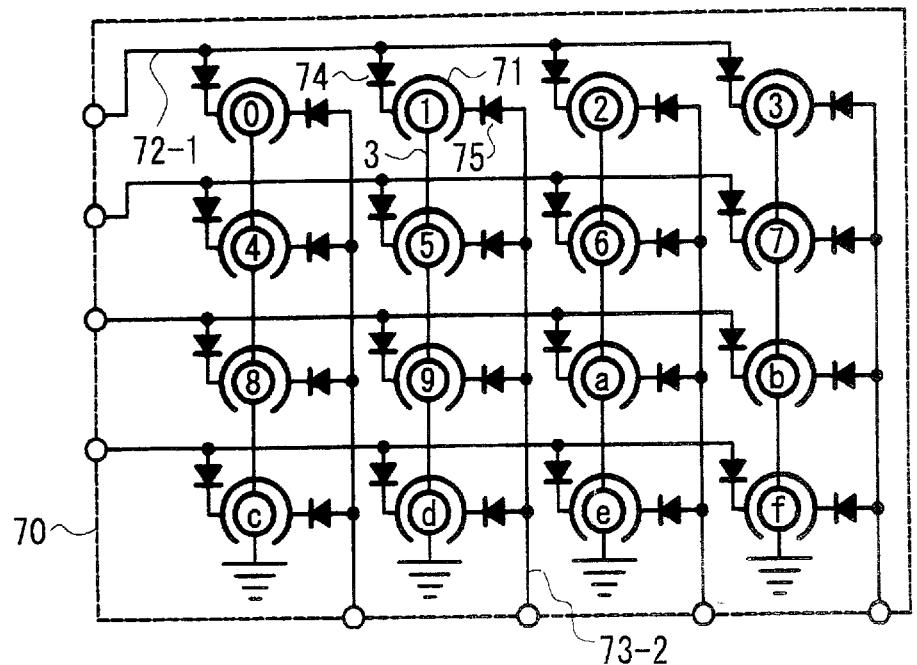

FIG. 7 is an electrical circuit diagram of the circuit board for method C.

Figure 8:
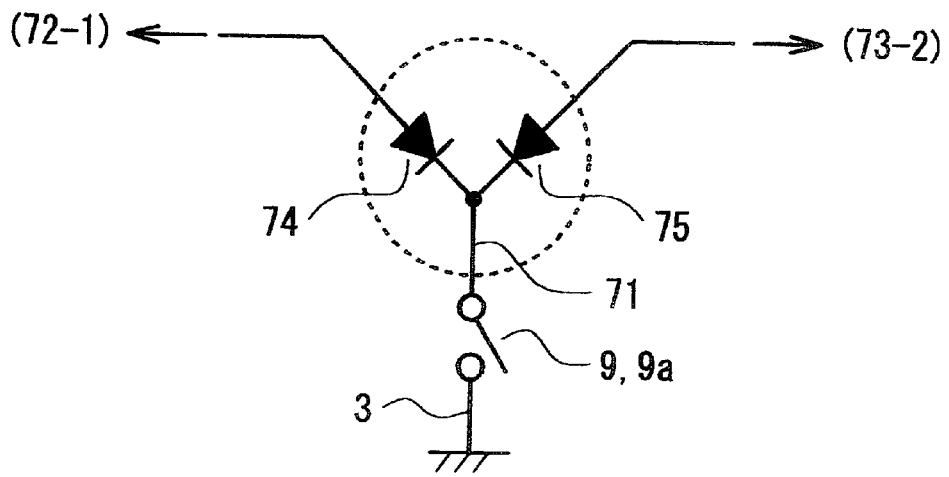

FIG. 8 is an equivalent circuit diagram of each selection key part for method C.

Figure 9:
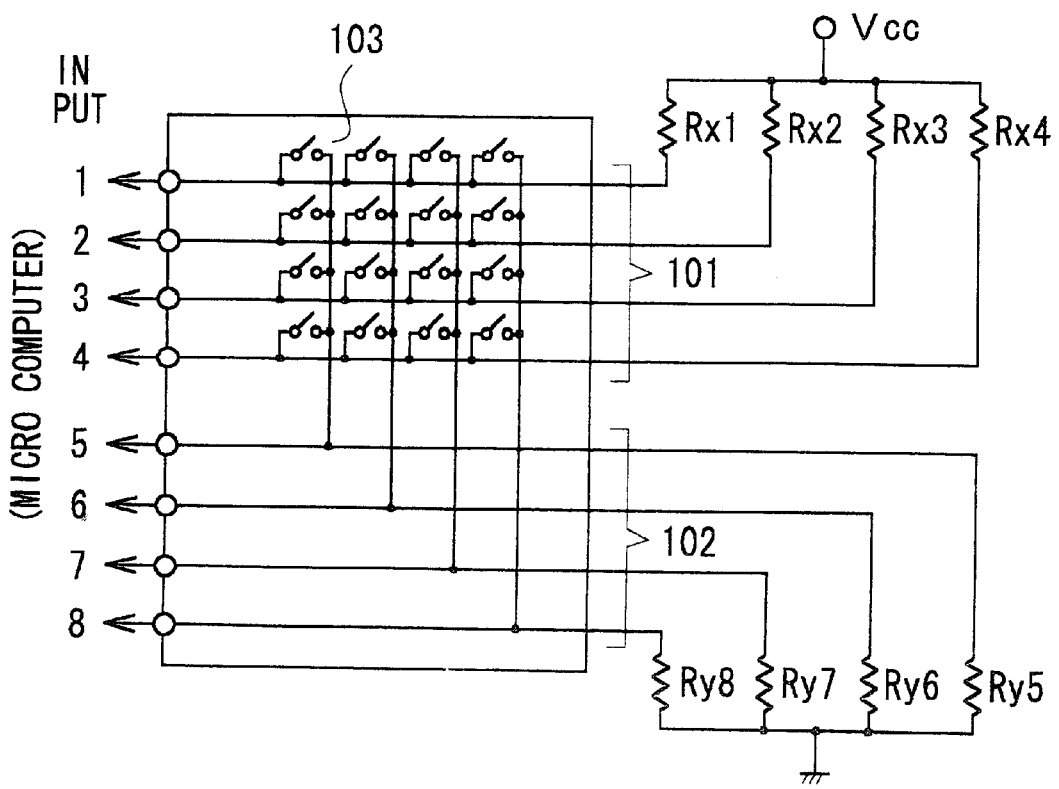

FIG. 9 is an electrical circuit diagram of the key matrix according to the prior art.

Figure 10:
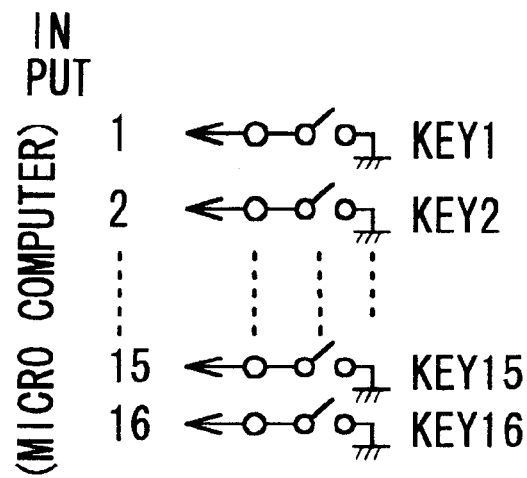

FIG. 10 is an electrical circuit diagram of a key matrix (single type) according to the prior art.

Figure 11:
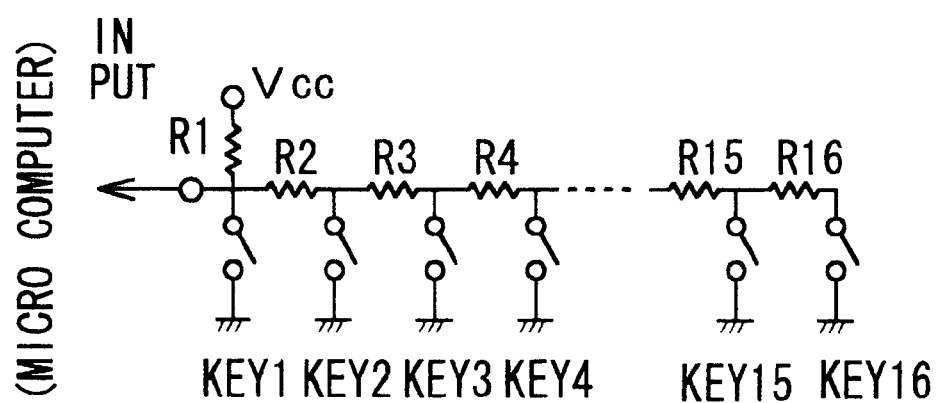

FIG. 11 is an electrical circuit diagram of a key matrix (A/D type) according to the prior art.

DETAILED DESCRIPTION OF THE PREFERRED EMBODIMENTS

A preferred embodiment of a key matrix circuit according to the present invention is described in detail below, with references being made to FIG. 1 to FIG. 8.

Figure 1:
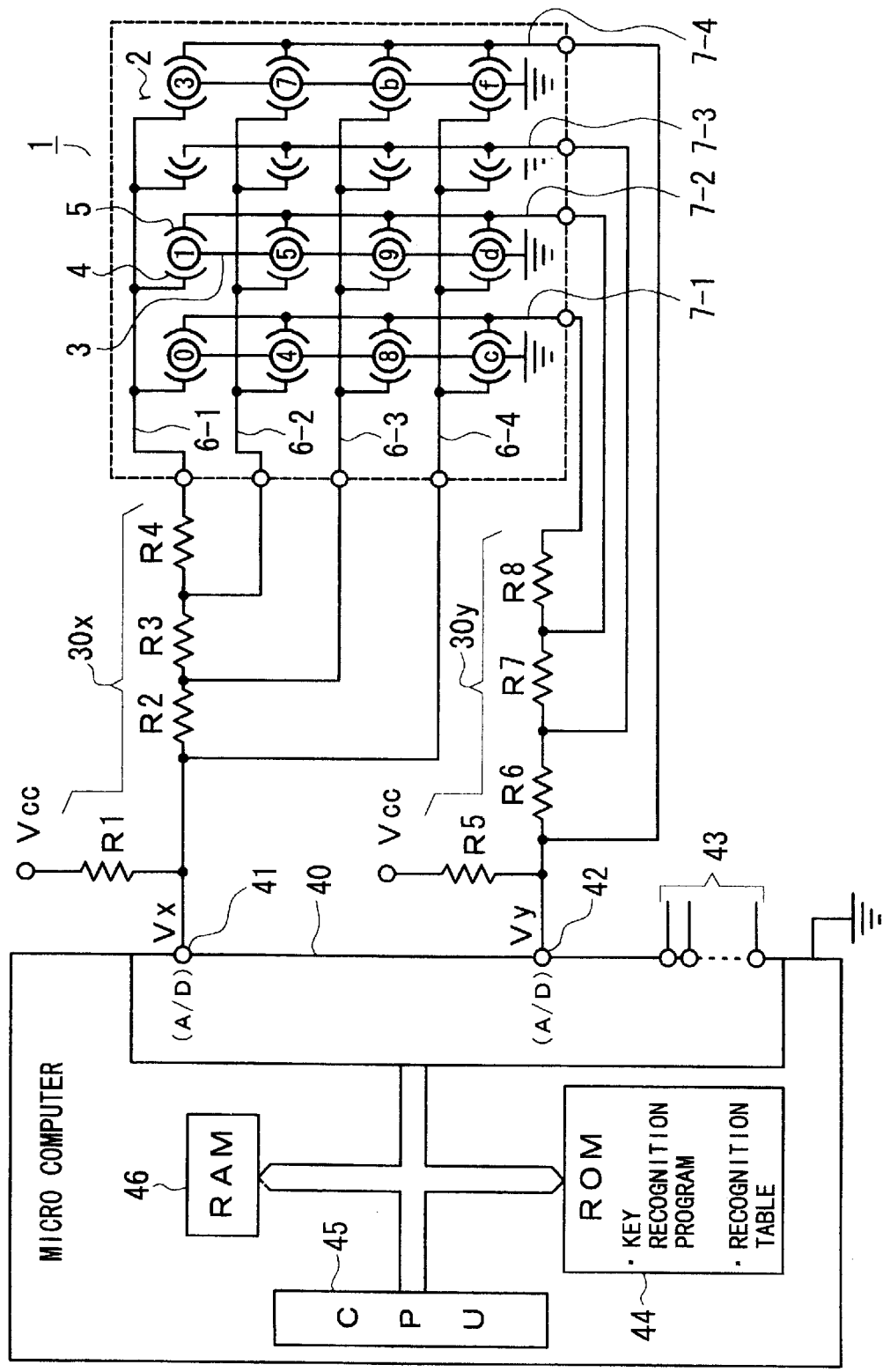
FIG. 1 is a block diagram showing the basic configuration of a key matrix circuit according to an embodiment of the present invention.

First, FIG. 1 is a block diagram showing the basic configuration of a key matrix circuit provided in an operating panel of a radio apparatus.

In FIG. 1, the reference numeral 1 denotes a keyboard having a 4-by-4 key matrix arrangement and its associated circuit board (hereinafter referred to as the keyboard circuit board), 30$x$ and 30$y$ are voltage-dividing circuits, and 40 is a microcomputer circuit.

Figure 2:
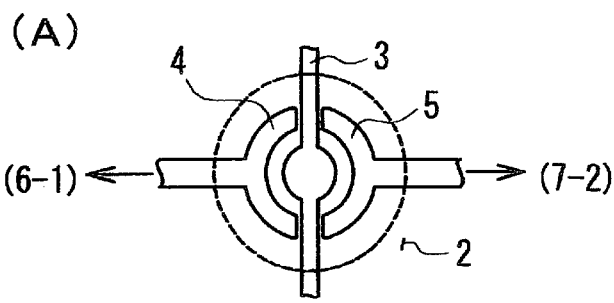
FIG. 2 shows the configuration of each selection key on the keyboard and circuit board, FIG. 2(A) being a plan view of the conductive pattern formed on the circuit board side, and FIG. 2(B) being a cross-section view of the selection key part.

The configuration of each selection key part of the keyboard circuit board 1 is shown in FIG. 2, in which (A) is a plan view of a conductive pattern formed on the circuit board side, and (B) is a cross-section view of the selection key part.

Referring to the selection key [1] part of FIG. 1 and FIG. 2(A), two arc-shaped terminals 4 and 5 are formed at symmetrical positions on both sides of a common ground circuit 3 formed in the row direction, the terminal 4 being connected to a connection circuit 61 that is formed in the row direction in a region in which contact is not made with the selection key, and the terminal 5 being connected to a connection circuit 7-2 that is formed in the column direction in a region in which contact is not made with the selection key. The common ground circuit 3 is formed circularly between the terminals 4 and 5, so as to establish a large contact surface area.

Turning to FIG. 2, the keyboard 8 side is a rubber key pad, having knobs 9 formed at positions that correspond to the regions in which terminals 4 and 5 are formed on the circuit board 2 side, the circuit board side surfaces of the knobs 9 serving as knob contacts 9$a$ having an electrically conductive surface.

Therefore, when a knob 9 of a selection key is pressed, the knob contact 9$a$ makes contact with the terminals 4 and 5 and the common ground circuit 3, so that the connection circuits 6-1 and 7-2 are grounded.

While the above description is for the case of the selection key [1], the same applies for the other selection keys as well and, as is clear from FIG. 1, when a selection key corresponding the p-th row (where p=1,2,3, or 4) and the q-th column (where q=1, 2, 3, or 4), the connection circuits 6-$p$ and 7-$q$ are grounded.

The common ground circuit 3 and the connection circuits 6-$p$ and 7-$q$ formed on the surface of the circuit board 2 must be mutually insulated from one another, these conductive patterns being formed with an insulating layer at appropriate positions therebetween.

The voltage-dividing circuit 30$x$ is formed by the series connection of resistances R1, R2, R3, and R4 between the power supply voltage Vcc and the connection circuit 6-1 in the row direction, the row-direction connection circuits 6-4, 6-3, and 6-2, respectively, being connected at the connection points between R1 and R2, R2 and R3, and R3 and R4, and the divided voltage Vx at the connection point between R1 and R2 being output to the microcomputer circuit 40.

The voltage-dividing circuit 30$y$ is formed by the series connection of resistances R5, R6, R7, and R8 between the power supply voltage Vcc and the connection circuit 7-1 in the column direction, the row-direction connection circuits 7-4, 7-3, and 7-2, respectively, being connected at the connection points between R5 and R6, R6 and R7, and R7 and R8, and the divided voltage Vy at the connection point between R5 and R6 being output to the microcomputer circuit 40.

The microcomputer circuit 40 has ports 41 and 42, to which divided voltages Vx and Vy from the voltage-dividing circuits 30$x$ and 30$y$ are input, and various I/O ports 43 for control of functions of the radio apparatus, and in this embodiment, a particular feature of the microcomputer circuit 40 is the provision of ROM 44, into which are stored a key recognition program and recognition table that is accessed during the course of executing this program.

Figure 3:
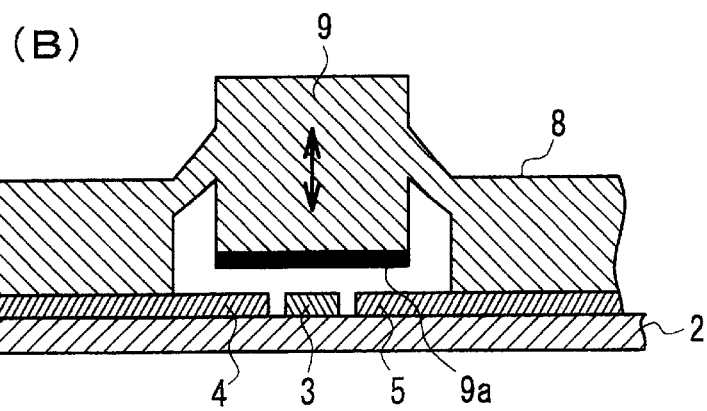
FIG. 3 is a drawing showing the configuration of a recognition table of a microcomputer circuit.

The makeup of the recognition table is shown in FIG. 3, this table having control commands that are related to each selection key [1] through [f], corresponding to combinations of voltage level data that it is possible for the divided voltage Vx and the divided voltage Vy to take.

That is, in FIG. 1, if we consider the selection keys arranged in the row direction, if any one of the keys [0, 1, 2, 3] is set to on, the divided voltage $$Vx=Vcc*(R2+R3+R4)/(R1+R2+R3+R4)$$

is output to the port 41.

Similarly, if any of the keys [4, 5, 6, 7] is set to on, the divided voltage $$Vx=Vcc*(R2+R3)/(R1+R2+R3)$$

is output to the port 41.

If any of the keys [8, 9, a, b] is set to on, the divided voltage $$Vx=Vcc*R2/(R1+R2)$$

is output to the port 41.

If any of the keys [c, d, e, f] is set to on, the divided voltage $$Vx=Vcc*0=0$$

is output to the port 41.

If we now consider the selection keys arranged in the column direction, if any one of the keys [0, 4, 8, c] is set to on, the divided voltage $$Vy=Vcc*(R6+R7+R8)/(R5+R6+R7+R8)$$

is output to the port 42.

Similarly, if any of the keys [ 1, 5, 9, d] is set to on, the divided voltage $$Vy=Vcc*(R6+R7)/(R5+R6+R7)$$

is output to the port 42.

If any of the keys [2, 6, a, e] is set to on, the divided voltage $$Vy=Vcc*R6/(R5+R6)$$

is output to the port 42.

If any of the keys [3, 7, b, f] is set to on, the divided voltage $$Vy=Vcc*0=0$$

is output to the port 42.

If the table is generated with Vcc=5 V, resistance values of R1=R5=1 kΩ, R2=R6=250 Ω, R3=R5=450 Ω, and R4=R8=800 Ω, and the assumed maximum error of ±0.3 V, the relationships of correspondence shown in FIG. 3 will result.

While in FIG. 3 the numbers [0 to f] of selection keys are entered at positions corresponding to combinations of the divided voltages Vx and Vy, in actuality control commands related to the selection keys are entered.

Figure 4:
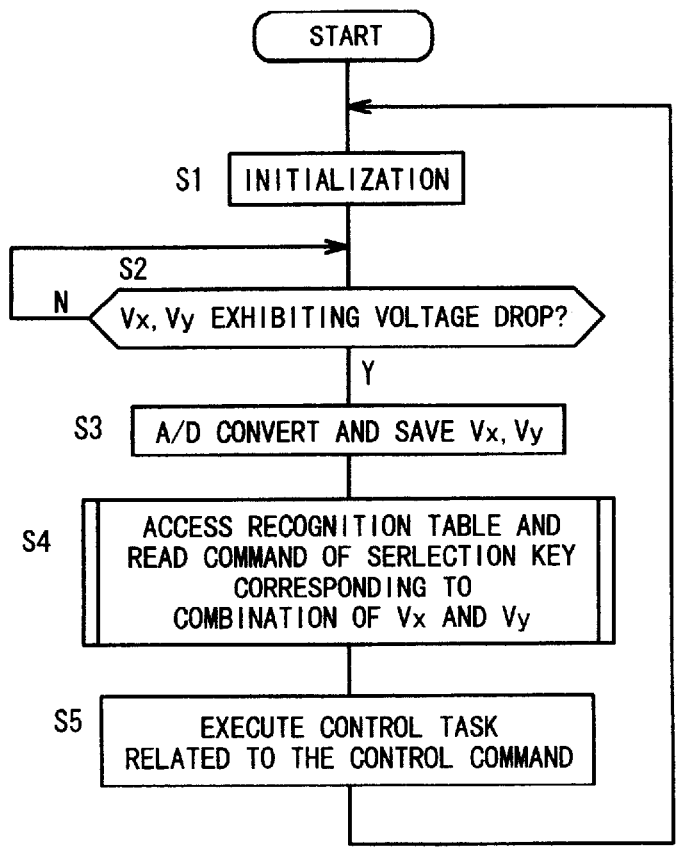
FIG. 4 is a flowchart showing the operating procedure based on a key recognition program of the microcomputer circuit.

The operating procedure based on the key recognition program of the microcomputer circuit 40 in the key matrix circuit of FIG. 1 is described below, with reference to the flowchart of FIG. 4.

First, the CPU 45 of the microcomputer circuit 40 initializes the system, and goes into the waiting condition, in which the input voltages Vx and Vy at the ports 41 and 42 are monitored (steps S1 and S2).

At this point, if any selection key of the keyboard 1 is pressed, when a voltage drop in the input voltages Vx and Vy at the ports 41 and 42 is detected, the CPU 45 converts the voltages Vx and Vy to digital data by means of an internal A/D converter, and saves this data into the RAM 46 (step S3).

Referring to the recognition table in the ROM 44, a control command that has been linked to the combination of voltage levels Vx and Vy is read into the various I/O ports 43, and a control task of the radio apparatus that is called for by the selection key that was pressed is executed (steps S4 and S5).

For example, with the value of the power supply voltage Vcc and the resistance values R1 to R8 set as noted above, if the selection key [6] is pressed, the divided voltages are $$Vx=Vcc*(R2+R3)/(R1+R2+R3)=2.06 \text{ V and}$$

$$Vy=Vcc*(R6/(R5+R6)=1 \text{ V.}$$

Under these conditions, a control command related to the selection key [6] is read from the recognition table shown in FIG. 3 and this command is executed.

In this embodiment, therefore, even though the keyboard circuit board 1 is a 4-by-4 matrix arrangement, it is only necessary to have two ports 41 and 42 at the microcomputer circuit 40 in order to recognize the selection key that is pressed. For this reason, it is possible to configure the output circuits (voltage-dividing circuits 30x and 30y) from the keyboard circuit board 1 side as simple series resistance circuits.

Because it is possible to establish a threshold of 1-V steps for discriminating the divided voltages Vx and Vy when using a power supply voltage Vcc of 5 V, it is possible to configure a stabilized key matrix circuit with no malfunctioning.

While the above-noted embodiment is for the case of a 4-by-4 matrix arrangement, if one set of connection circuits for selection keys in the row direction and a voltage-dividing circuit are added, it is possible to accommodate a 32-key arrangement, and adding yet another set of connection circuits for selection keys in the column direction and a voltage-dividing circuit enables accommodation of a 48-key arrangement, and even in this case it is sufficient for the microcomputer circuit to have just four input ports.

While the above-noted embodiment made use of a configuration of selection key parts in the keyboard circuit board such as shown in FIG. 2, it is also possible to employ the following methods.

Method A

This type of selection key part is shown in FIG. 5, of which (A) is a plan view of the conductive pattern formed on the circuit board side, (B) is a cross-section view showing the selection key part and the connection condition of the connection circuit at the end part of the circuit board, and (C) is a perspective view of the keyboard, seen from the rear.

As shown in FIG. 5(A), terminals 52 and 53 formed on the circuit board 51 correspond to the terminals 4 and 5 (refer to FIG. 2) in the above-noted embodiment. In this method, however, because there is no common ground circuit in the region of the circuit board 51 in which the terminals 52 and 53 are formed, the terminals 52 and 53 are planar with depressions and protrusions that mutually fit into one another, thereby enabling the establishment of a larger contact surface area.

The basic configuration of the keyboard 54 side is the same as the above-noted embodiment, with knobs 55 formed at positions of the rubber key pad corresponding to the terminals 52 and 53 on the circuit board 51 side. In this method, however, a conductive film 56 is applied to the entire rear surface of the keyboard 54, this conductive film 56 forming the common ground circuit.

Although the rear sides of the knobs 55 are also covered by the conductive film 56, when a knob 55 is pressed, the terminals 52 and 53 directly therebelow are shorted so as to be grounded, thereby forming the same type of switching circuit as in the previous embodiment.

As is the case with the previous embodiment, the connection circuits connected to the terminals 52 and 53 are mutually insulated and, in the method, in order to insulate the connection circuits and the conductive film 56, which forms the common ground circuit, an insulating film 57 is inserted between a region of the circuit board 51 other than that in which are formed the terminals 52 and 53 and the keyboard 54 side.

While the conductive film 56 on the keyboard 54 side forms the common ground circuit, there is connection to the with the conductive pattern 58 formed in end region of the circuit board 51, this leading to the common ground circuit (not shown in the drawing).

According to this arrangement, there is no need to have a common ground circuit on the circuit board 51, thereby facilitating the design of the conductive pattern on the surface of the circuit board.

Method B

This type of selection key part is shown in FIG. 6, of which (A) is a cross-section view, and (B) is an overall perspective view of the metal sheet used as a common ground circuit.

In this method, in place of the conductive film 567 applied to the rear surface of the keyboard 54, there is an intervening conductive resilient metal sheet (for example, a sheet of phosphor bronze) 61.

This resilient metal sheet 61 has spherical protrusions 61a formed therein at positions corresponding to knobs 62 of each selection key 62 and, as shown in FIG. 6(A), this is inserted between the keyboard 63 and the conductive pattern (terminals 65 and 66 and the connection circuits) of the circuit board 64. Because the radius of curvature of the protruding parts 61a is enlarged, upon receiving a pressing force from a knob 62, the protruding part 61a is depressed, so as to short terminals 65 and 66. When the pressure is released, however, the resilience pushes the knob 62 to return it to its original condition.

The configuration of the keyboard 63, with the exception of the provision of the conductive film 56 is the same as in FIG. 5(A) with regard to method A. Another similar feature is that, in order to use the resilient metal sheet 61 as the common ground circuit, it is necessary to insert an insulating film 67 between it and the circuit board 1 side.

In the method A shown in FIG. 5, therefore, using the resilience of a thinly formed part 59 in the area surrounding a knob 55, the knob 55 is returned to its original condition after being pressed and, in this method, it is possible to have this function served by the resilient metal sheet that serves also as the common ground circuit.

Because the conductive film 56 is applied to the flexible part 59 of method A (FIG. 5) as well, although deformation of this part 59 can encourage peeling of the conductive film 56, leading to the risk of a bad electrical connection to the common ground circuit, with method B, this problem does not occur.

Method C

In this method, the configuration of the keyboard side is the same as shown in FIG. 2 (B) above. There is, however, a difference with regard to the terminals on the circuit board side.

Specifically, whereas there were two independent terminals 4 and 5 corresponding to each selection key in the arrangement shown in FIG. 1 and FIG. 2, in method C, as shown by the selection key [1] in FIG. 7 (electrical circuit diagram of the circuit board), this is formed as a single terminal 71, the connection circuits 72-1 and 73-1 in the row direction and column direction which include the selection key [1] and this single terminal 71 being connected by diodes 74 and 75, which are oriented so that their forward directions are the directions from each of the connection circuits 72-1 and 73-1 to the single terminal 71.

The same circuit configuration is used for the other selection keys of the circuit board 70, and the single terminals, common ground circuits, and connection circuits are insulated from one another.

The equivalent circuit diagram of the circuit configuration of each selection key is, therefore, as shown in FIG. 8, the configuration on the keyboard side being the same as shown in FIG. 2(B), the reference numerals 9 and 9a in FIG. 8 corresponding to the knob and knob contact, and the reference numeral 3 corresponding to the common ground circuit.

As a result, a diode OR circuit is formed between the single terminal 71 and the connection circuits 72-1 and 73-1, so that only in the case in which the selection key [1] is pressed, so that the single terminal 71 and the common ground circuit 3 are shorted, do diodes 74 and 75 conduct, thereby making a connection between the single terminal 71 and the connection circuits 72-1 and 73-1. In the condition in which the selection key [1] is not pressed, however, there is a high-impedance condition between the connection circuits 72-1 and 73-1 and the common ground circuit 3.

According to this method, because of the single terminal configuration and the establishment of a high-reliability high-impedance circuit, it is possible to achieve a key matrix circuit which operates without malfunctioning.

By adopting the configurations described above, a key matrix circuit according to the present invention achieves the following effects.

According to the present invention, in a key matrix circuit in which, by inputting a voltage generated in response to the pressing of a selection key of a keyboard to a microcomputer circuit, and having the microcomputer circuit recognize from that voltage level which key has been pressed, in response to which various control commands are executed, even if the keyboard has a large number of keys, it is possible to minimize the number of input circuits to the microcomputer circuit and also to establish a large voltage level difference for recognition of keys, thereby reducing the number of input ports to the microcomputer circuit, reducing the number of manufacturing process steps, and the manufacturing cost, while providing a key matrix circuit having high reliability.

It is possible to achieve a rational configuration of a keyboard suited for application of the present invention.

Additionally, the common ground circuit of the keyboard circuit board may be formed by a conductive film that is applied to the rear surface on the keyboard side, thereby simplifying the circuit on the circuit board side.

Alternatively, the common ground circuit of the keyboard circuit board may be formed by a conductive resilient metal sheet, which is made to serve also as the rebounding force of the selection keys, thereby achieving a configuration which does not experience bad connections to the common ground circuit.

Furthermore, according to the present invention, the two terminals provided so as to correspond to the selection keys are combined into a single terminal, this single terminal and the connection circuits being connected via a diode OR circuit, the configuration being such that a selection key caused the grounding of the single terminal, thereby achieving a key matrix circuit with no malfunctioning.

While several embodiments of the present invention have been illustrated and described, it will also be apparant to those skilled in the art that various modifications may be made without departing from the spirit and scope of the invention. Accordingly, the invention is not to be limited to the specific embodiments described herein but is to be accorded the full breadth and scope of the following claims.

What is claimed is:

1. A key matrix circuit comprising:

a keyboard comprising a plurality of selection keys arranged in an N-row-by-M-column matrix;

a board comprising switching circuits having a first terminal and a second terminal that are connected to a common ground circuit when a corresponding selection key is pressed, the first terminals of each switching circuit, corresponding to said selected key in a row direction being connected to a first connection circuit in units of rows, and the second terminals of each switching circuit, corresponding to a selected key in a column direction being connected to a second connection circuit in units of columns;

an output circuit wherein a fixed-voltage power supply and one circuit of said first connection circuits are connected by a first voltage-dividing circuit formed by a series connection of N resistances, with other first connection circuits connected to points between other said resistances of said first voltage-dividing circuit, a first output point being a resistance connection point of said first connection circuit via one resistance from said fixed-voltage power supply, and wherein a fixed-voltage power supply and one circuit of the second connection circuits are connected by a second voltage-dividing circuit formed by a series connection of M resistances, with other second connection circuits connected to points between other said resistances of said second voltage-dividing circuit, a second output point being a resistance connection point of the second connection circuit via one resistance from the fixed-voltage power supply; and a microcomputer circuit which A/D converts and captures the voltages at said first output point and said second output point of said output circuit and, using a data table, into which are stored identification data and control commands corresponding to combinations of voltage levels that the first output point can take and voltage levels that the second output point can take, these combinations being related to each selection key, performs recognition of a pressed selection key and execution of corresponding control.

2. A key matrix circuit according to claim 1, wherein said keyboard has an electrically conductive knob contact formed on said circuit board side of each key of a rubber key pad, and wherein at positions on said circuit board corresponding to each said selection key a first and second terminal are formed by an electrically conductive pattern, a common ground circuit being formed by a conductive pattern between said first and second terminals, and wherein the conductive patterns of said first connection circuit, said second connection circuit, and said common ground circuit are formed on said circuit board surface with insulation therebetween.

3. A key matrix circuit according to claim 1, wherein said keyboard has knobs formed on said circuit board side of each said selection keys of a rubber key pad, said circuit board sides of each knob having an electrically conductive surface corresponding to a common ground circuit, said circuit board having, at positions corresponding to each said selection keys of said keyboard, a first terminal and a second terminal formed by conductive patterns, these being formed on a surface of the circuit board with mutual insulation therebetween, and a first connection circuit and a second connection circuit being insulated from said conductive surface on the keyboard side.

4. A key matrix circuit according to claim 1, wherein said keyboard comprises knobs formed on said circuit board side of each said selection keys of a rubber key pad and, at positions on said circuit board surface corresponding to each said selection key of said keyboard, a first terminal and a second terminal are formed by conductive patterns, and conductive patterns of a first connection circuit and a second connection circuit being formed so as to be mutually insulated and wherein between said keyboard and said circuit board, at positions corresponding to each said selection key, is formed a resilient and electrically conductive metal sheet having a part protruding toward the knob side, with an insulating layer inserted at only a joining region with respect to said circuit board surface, said resilient metal sheet being used as said common ground circuit.

5. A key matrix circuit according to claim 1, wherein a first terminal and a second terminal formed at positions corresponding to the selection key on the keyboard side are formed as a single terminal, and wherein within a path from said first connection circuit and said second connection circuit to said single terminal, a diode is inserted so that its forward direction is from each of said connection circuits to said single terminal.

* * * * *